United States Patent
O'Neill et al.

(10) Patent No.: US 7,859,328 B2
(45) Date of Patent: *Dec. 28, 2010

(54) SUBSTRATE STRESS MEASURING TECHNIQUE

(75) Inventors: Thomas G. O'Neill, Mountain View, CA (US); Robert J. Bosnyak, Tacoma, CA (US)

(73) Assignee: Oracle America, Inc., Redwood City, CA (US)

(*) Notice: Subject to any disclaimer, the term of this patent is extended or adjusted under 35 U.S.C. 154(b) by 3 days.

This patent is subject to a terminal disclaimer.

(21) Appl. No.: 12/401,611

(22) Filed: Mar. 10, 2009

(65) Prior Publication Data

US 2009/0273393 A1    Nov. 5, 2009

Related U.S. Application Data

(63) Continuation of application No. 11/128,966, filed on May 13, 2005, now Pat. No. 7,521,993.

(51) Int. Cl.
*H01L 25/00* (2006.01)

(52) U.S. Cl. ..................... 327/565; 327/566

(58) Field of Classification Search ............... 327/565, 327/566
See application file for complete search history.

(56) References Cited

U.S. PATENT DOCUMENTS

| | | | |
|---|---|---|---|
| 3,603,848 A | 9/1971 | Sato et al. |
| 4,768,076 A | 8/1988 | Aoki et al. |
| 4,933,298 A | 6/1990 | Hasegawa |
| 5,317,175 A | 5/1994 | Throngnumchai |
| 6,052,025 A | 4/2000 | Chang et al. |
| 6,164,781 A | 12/2000 | Tsang et al. |
| 6,794,718 B2 | 9/2004 | Nowak et al. |
| 6,867,460 B1 | 3/2005 | Anderson et al. |
| 6,911,383 B2 | 6/2005 | Doris et al. |
| 6,940,109 B2 | 9/2005 | Patel et al. |
| 6,949,796 B1 | 9/2005 | Ellis-Monaghan et al. |
| 6,967,351 B2 | 11/2005 | Fried et al. |
| 7,087,477 B2 | 8/2006 | Fried et al. |
| 7,115,920 B2 | 10/2006 | Bernstein et al. |
| 7,183,142 B2 | 2/2007 | Anderson et al. |
| 7,202,534 B2 | 4/2007 | Ohmi et al. |
| 7,242,241 B2 | 7/2007 | Toumazou et al. |
| 7,265,495 B2 | 9/2007 | Date |
| 7,319,258 B2 | 1/2008 | Yang et al. |
| 7,521,993 B1 * | 4/2009 | O'Neill et al. ............... 327/565 |
| 2004/0038464 A1 | 2/2004 | Fried et al. |

* cited by examiner

*Primary Examiner*—Kenneth B. Wells
(74) *Attorney, Agent, or Firm*—Osha • Liang LLP

(57) ABSTRACT

A system, including: a first current mirror having a first current, formed of multiple devices disposed on a substrate, where, when a stress is present, a behavior of a device of the multiple devices forming the first current mirror depends on a direction in which the device of the multiple devices forming the first current mirror is disposed on the substrate; a second current mirror having a second current, formed of multiple devices disposed on the substrate, where, when the stress is present, a behavior of a device of the multiple devices forming the second current mirror depends on a direction in which the device of the multiple devices forming the second current mirror is disposed on the substrate; and a device for measuring a ratio of a difference between the first current and the second current to a sum of the first current and the second current.

15 Claims, 3 Drawing Sheets

SUBSTRATE STRESS MEASURING TECHNIQUE

This application is a continuation of U.S. patent application Ser. No. 11/128,966, now issued as U.S. Pat. No. 7,521,993, entitled: "SUBSTRATE STRESS SIGNAL AMPLIFIER," and filed on May 13, 2005. Accordingly, this application claims benefit of U.S. patent application Ser. No. 11/128,966, now issued as U.S. Pat. No. 7,521,993, under 35 U.S.C. §120.

STATEMENT REGARDING FEDERALLY SPONSORED RESEARCH OR DEVELOPMENT

The present invention was made with the support of the government of the United States under contract NBCH020055 awarded by the Defense Advanced Research Projects Administration. The United States government may have certain rights in the present invention.

BACKGROUND

A typical computer system includes at least a microprocessor and some form of memory. The microprocessor has, among other components, arithmetic, logic, and control circuitry that interpret and execute instructions necessary for the operation and use of the computer system. In addition to the microprocessor and memory, a computer system has integrated circuits (ICs) that have various functionalities and communication paths, i.e., buses and wires that are necessary for the transfer of data among the aforementioned components of the computer system.

An integrated circuit (IC) may have hundreds of thousands up to millions of individual devices (e.g. transistors) deposited on a single semiconductor substrate. Such an IC is commonly referred to as a "Very Large Scale Integration" (VLSI) IC or "chip."

A common building block of an IC, such as a VLSI chip, is a device known as a "transistor." A transistor is a semiconductor device often partially made from silicon that regulates current or voltage and acts as a switch or gate for electronic signals. One type of transistor has three terminals that are electrically attachable to other electrical devices, such as, for example, resistors and power supplies, and even to other transistors in order to carry out an electrical circuit's function. A transistor's attributes, for example, length (L), width (W), and carrier mobility ($\mu$) (a ratio of a carrier's velocity to an applied external voltage) dictate how well the transistor conducts electrical current and under what circumstances particular behavior occurs.

One factor that may affect the operation of a transistor is the stress on the transistor. Stress is a measure of the force producing or tending to produce deformation in a body. Components of stress may be measured in units of pressure. The metric unit for pressure is the Pascal (Pa). Stress on a silicon-based transistor affects the transistor's carrier mobility ($\mu$). Stresses as large as $10^8$ Pa may produce mobility changes ($\Delta\mu/\mu$) on the order of 10%. The change in carrier mobility ($\Delta\mu/\mu$) has a component dependent on the direction in which the transistor is positioned ($\delta$) (also referred to as a "direction-dependent mobility change") and a component that is independent of the direction in which the transistor is positioned ($\alpha$) (also referred to as a "direction-independent mobility change"), i.e., $\Delta\mu/\mu$ is equal to ($\alpha+\delta$):

$$\frac{\Delta\mu}{\mu} = \alpha + \delta.$$

The above expression may often be approximated for computational simplicity as:

$$\frac{\Delta\mu}{\mu} = \alpha + \delta \approx \delta.$$

A transistor may be designed such that the orientation of its parts cancels the direction-dependent mobility change ($\delta=0$) effect of a stress. In such cases, only the direction-independent mobility change ($\alpha$) is present:

$$\frac{\Delta\mu}{\mu} = \alpha.$$

When in use, VLSI chips may be subject to a variety of stresses. Typical stresses include mechanical loading due to the packaging of these chips, thermal loading due to heat generated by circuits through power dissipation, and stresses applied to materials in close proximity to the VLSI chip. These stresses may lead to mechanical failure of the chip and/or mechanical failure of the material in close proximity to the chip. The larger the stress, the higher the chance for mechanical and/or circuit failure.

SUMMARY

According to one aspect of one or more embodiments of the present invention, a computer system comprises: a substrate; a first current mirror formed of at least two devices disposed on the substrate, wherein, when a stress is present, a behavior of at least one of the at least two devices forming the first current mirror is dependent on a direction in which the at least one of the at least two devices forming the first current mirror is disposed on the substrate; and a second current mirror formed of at least two devices disposed on the substrate, wherein, when the stress is present, a behavior of at least one of the at least two devices forming the second current mirror is dependent on a direction in which the at least one of the at least two devices forming the second current mirror is disposed on the substrate, wherein the at least one of the at least two devices forming the first current mirror is disposed in a non-parallel orientation to the at least one of the at least two devices forming the second current mirror.

According to another aspect of one or more embodiments of the present invention, a method of manufacturing comprises: disposing a first device on a substrate, the first device forming part of a first current mirror, wherein, when a stress is present, a behavior of the first device is dependent on a direction in which the first device is disposed on the substrate; and disposing a second device on the substrate in a non-parallel orientation to the first device, the second device forming part of a second current mirror, wherein, when the stress is applied, a behavior of the second device is dependent on a direction in which the second device is disposed on the substrate.

According to another aspect of one or more embodiments of the present invention, a method of operation comprises: propagating a first current through a first current mirror formed of at least two devices disposed on a substrate, wherein, when a stress is present, a behavior of at least one of the at least two devices is dependent on a direction in which the at least one of the at least two devices forming the first current mirror is disposed on the substrate; and propagating a second current through a second current mirror formed of at least two devices disposed on a substrate, wherein, when the stress is applied, a behavior of at least one of the at least two devices forming the second current mirror is dependent on a direction in which the at least one of the at least two devices forming the second current mirror is disposed on the substrate, wherein the at least one of the at least two devices forming the first current mirror and the at least one of the at least two devices forming the second current mirror are disposed in a non-parallel orientation with respect to each other.

Other aspects of the present invention will be apparent from the following description and the appended claims.

DETAILED DESCRIPTION

Figure 1:
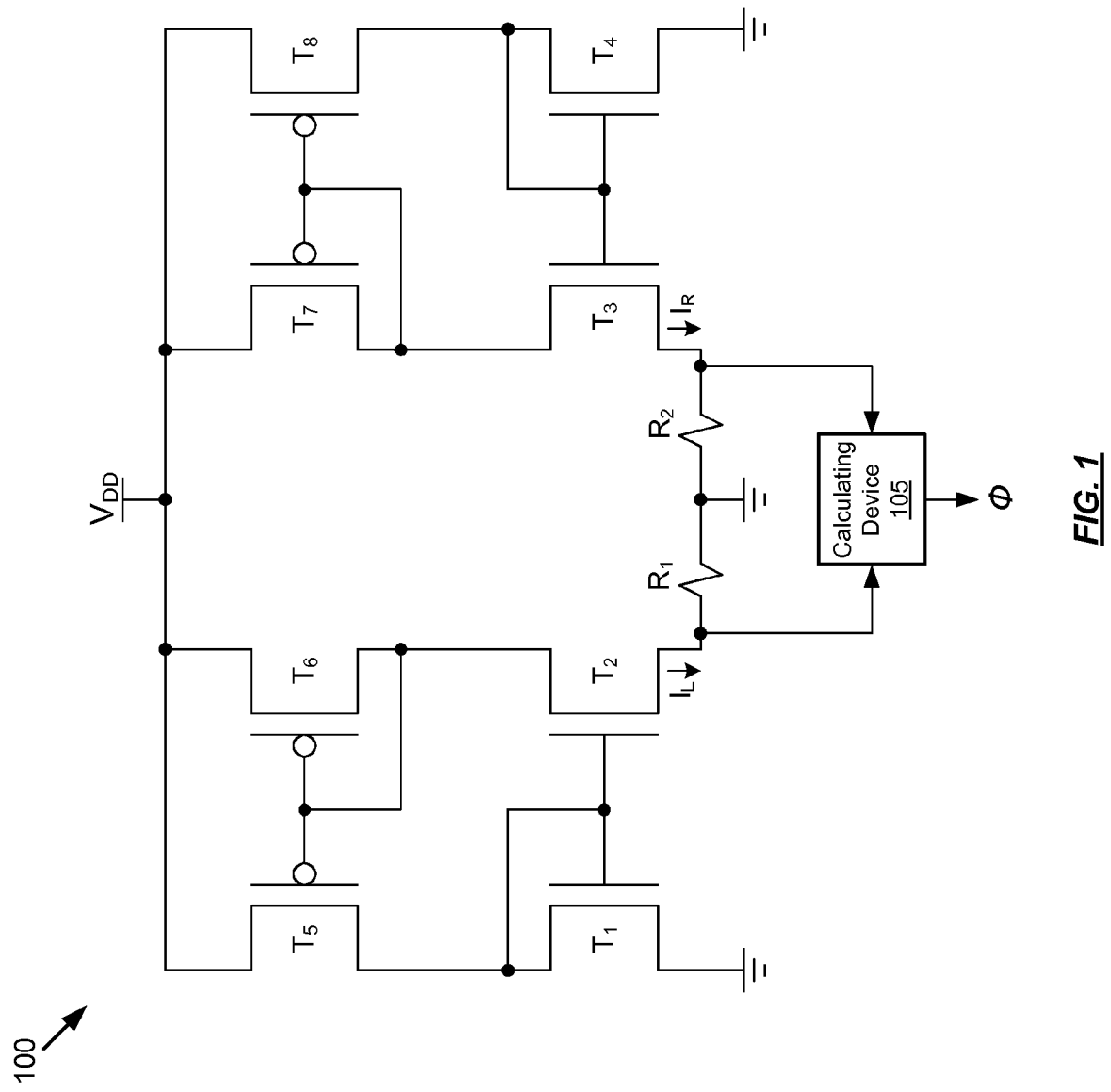
FIG. 1 shows a stress measuring circuit in accordance with an embodiment of the present invention.

Exemplary embodiments of the invention will be described with reference to the accompanying drawings. Like items in the drawings are shown with the same reference numbers.

In one or more embodiments of the present invention, numerous specific details are set forth in order to provide a more thorough understanding of the present invention. In other instances, well-known features have not been described in detail to avoid obscuring the invention.

Embodiments of the present invention relate to a circuit that may be used to produce a signal that is strongly dependent on a stress applied to the circuit and/or on a stress applied to a material in close proximity to the circuit. In order words, a circuit in accordance with one or more embodiments of the present invention amplifies a signal that is dependent on a stress applied to the circuit and/or to a material in close proximity to the circuit.

FIG. 1 shows an exemplary circuit 100 in accordance with an embodiment of the present invention. The circuit 100 includes eight transistors T1-T8 and two resistors R1 and R2. In the exemplary embodiment of FIG. 1, resistors R1 and R2 are of equal value (R1=R2), transistors T1 and T4 are of equal width ($W_{T1}=W_{T4}$), and transistors T2 and T3 are of equal width ($W_{T2}=W_{T3}$). The two sets of transistors T1-T2 and T3-T4 have widths related by a factor of $\omega^2$ (i.e., $\omega^2 W_{T1} = \omega^2 W_{T4} = W_{T2} = W_{T3}$, where $\omega \geq 1$). Selection of $\omega$ is a tradeoff between sensitivity and the maximum value of stress ($\delta_{MAX}$) desired to be measurable. In FIG. 1, transistors T1-T8 are of equal length (L).

Transistors T1, T2, T5 and T6 (referred to as forming the "left side" of the circuit 100) are interconnected such that the electrical current flowing through transistor T1 is approximately equal to the electrical current flowing through transistor T2. This electrical current is denoted $I_L$. In one or more embodiments of the present invention, the value of $\omega$ may also be selected to keep $I_L>0$ over a desired range of measurable stresses.

Transistors T3, T4, T7 and T8 (referred to as forming the "right side" of the circuit 100) are configured such that the electrical current flowing through transistor T3 is approximately equal to the current flowing through transistor T4. This electrical current is denoted $I_R$. In one or more embodiments of the present invention, the value of $\omega$ may also be selected to keep $I_R>0$ over a desired range of measurable stresses.

Resistors R1 and R2 provide a resistive path through which electrical currents $I_L$ and $I_R$, respectively, flow to ground. The values of resistors R1 and R2 are determined by desired values for $I_L$ and $I_R$, respectively, when the circuit is not under stress. $\delta_{MAX}$ can also be understood as the direction-dependent mobility change which reduces $I_L$ and/or $I_R$ to a negligible value.

Those skilled in the art will recognize the configurations of transistors T1, T2, T5, and T6, and T3, T4, T7 and T8 are current mirrors. Further, those skilled in the art will recognize that transistors T1-T4 are negative-channel metal-oxide semiconductor (NMOS) transistors and transistors T5-T8 are positive-channel metal-oxide semiconductor (PMOS) transistors.

Stress has the effect of increasing or decreasing the differences in the strength of transistors. Mathematically, stress is equivalent to some of the transistors growing longer and others being reduced in length. A small increase in the carrier mobility ratio of transistors in the left side of circuit 100 ($\mu_{T2}/\mu_{T1}$) may yield a large increase in the electrical current $I_L$. The opposite effect may occur in the right side of circuit 100—namely, a large decrease in the electrical current $I_R$ resulting from a small change in $\mu_{T3}/\mu_{T4}$. Simultaneous measurements of $I_L$ and $I_R$ may be used to infer the magnitude of the stress applied to the circuit. In particular, a direction-dependent mobility change ($\delta$) may be inferred from a measurement of the relative difference in the current through the two sides of the circuit ($\Phi$):

$$\Phi = \frac{I_L - I_R}{I_L + I_R}.$$

Figure 2:
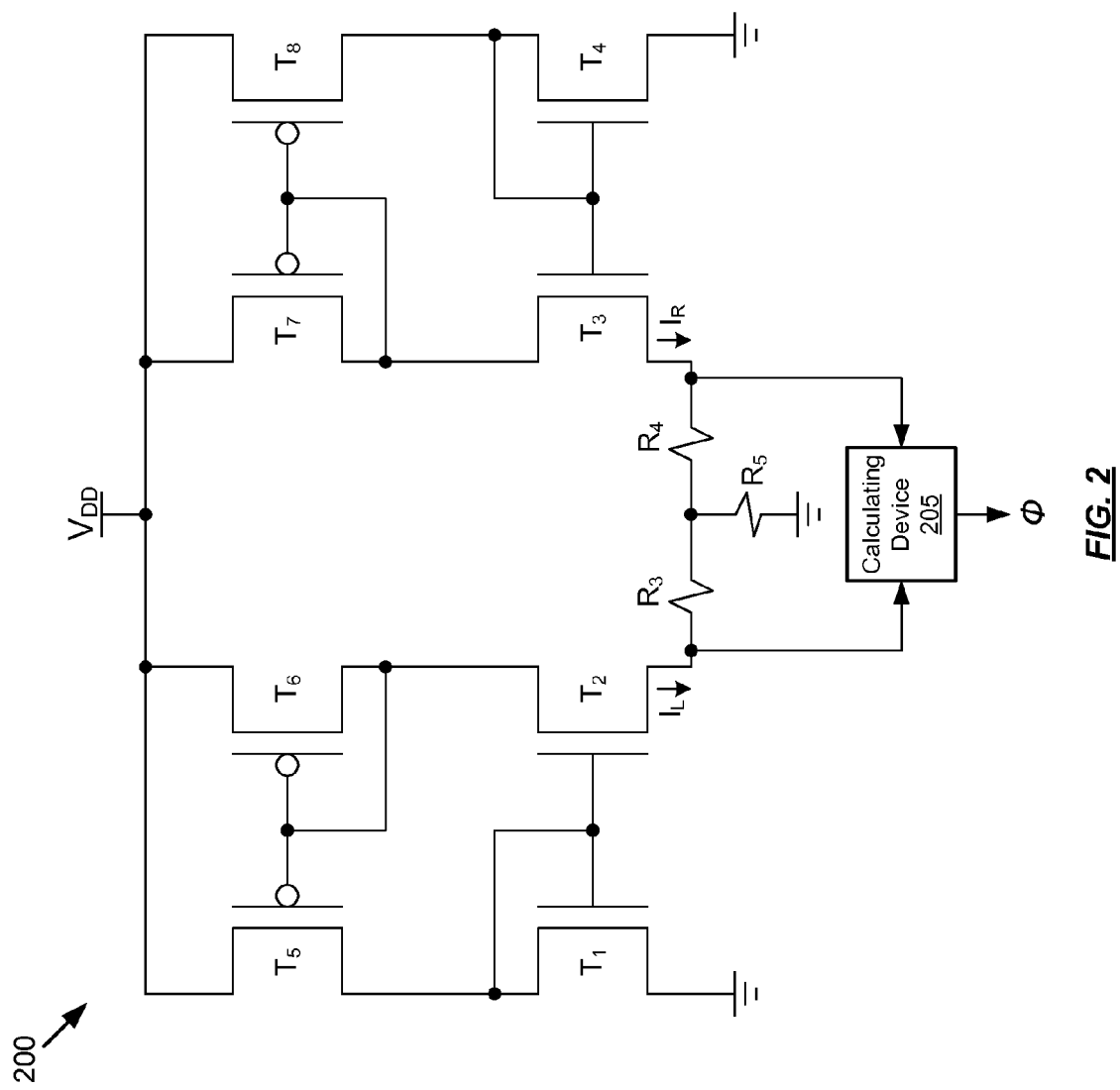
FIG. 2 shows a stress measuring circuit in accordance with an embodiment of the present invention.
Figure 3:
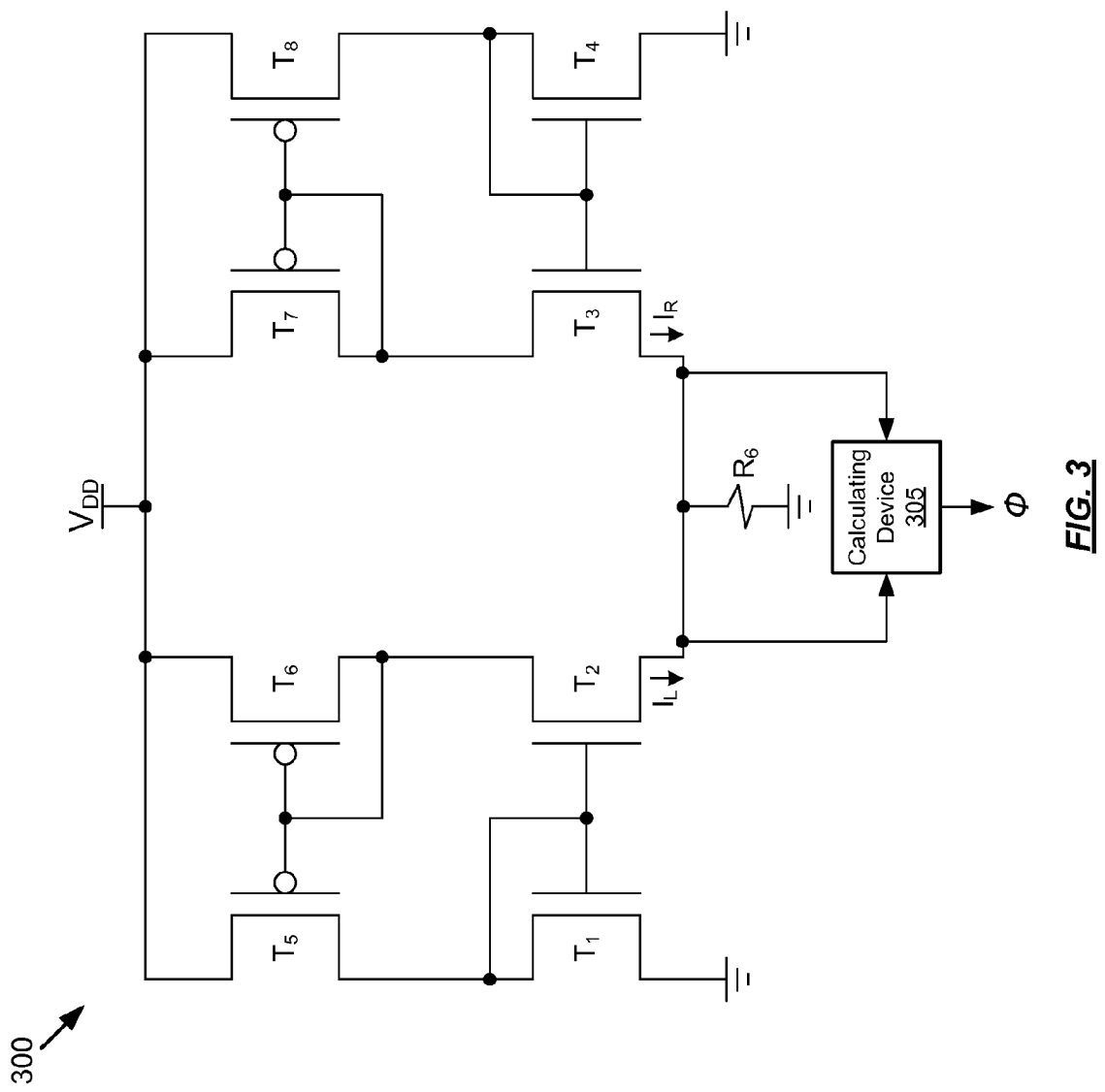
FIG. 3 shows a stress measuring circuit in accordance with an embodiment of the present invention.

In one or more embodiments of the present invention, calculating devices (105), (205), and (305) of FIGS. 1, 2, and 3, respectively, are configured to calculate the ratio $\Phi$ after measuring $I_L$ and $I_R$.

In one or more embodiments of the present invention, T1 and T4 may each be designed such that when a stress is present, the change in carrier mobility of both transistors is not affected by the direction in which the transistors are positioned ($\delta$=0). Transistors T2 and T3 are oriented perpendicularly so that the carrier mobility of both transistors is affected by the direction in which the transistors are positioned, but with an opposite polarity, i.e., $$\frac{\Delta \mu_{T2}}{\mu_{T2}} \approx +\delta \text{ and } \frac{\Delta \mu_{T3}}{\mu_{T3}} \approx -\delta.$$

In such an embodiment, the relative difference in the current through the two sides of the circuit 100 ($\Phi$) reduces to an expression in terms of $\omega$ and $\delta$. This allows a precise determination of $\delta$ for a measured value of $\Phi$.

Although transistors T2 and T3 are described as being oriented perpendicularly in FIG. 1, in one or more other embodiments of the present invention, these transistors may be oriented in any non-parallel orientation. For example, in one embodiment of the present invention, transistor T2 may be oriented with a 75 degrees offset with respect to transistor T3.

In one or more embodiments of the present invention, transistors T2 and T3 may each be designed such that when a stress is present, the carrier mobility of both transistors is not affected by the direction in which the transistors are positioned ($\delta=0$). Transistors T1 and T4 are oriented perpendicularly so that the carrier mobility of both transistors is affected by the direction in which the transistors are positioned, but with an opposite polarity, i.e., $$\frac{\Delta\mu_{T1}}{\mu_{T1}} \approx -\delta \text{ and } \frac{\Delta\mu_{T4}}{\mu_{T4}} \approx +\delta.$$

In such an embodiment, the relative difference in the current through the two sides of the circuit ($\Phi$) reduces to an expression in terms of $\omega$ and $\delta$. This allows a precise determination of $\delta$ for a measured value of $\Phi$.

Although transistors T1 and T4 are described as being oriented perpendicularly, in one or more other embodiments of the present invention, these transistors may be oriented in any non-parallel orientation. For example, in one embodiment of the present invention, transistor T1 may be oriented with an 80 degrees offset with respect to transistor T4.

In one or more embodiments of the present invention, transistor T2 is oriented perpendicularly to transistor T3, transistor T1 is oriented perpendicularly to transistor T2 (and thus oriented in parallel or anti-parallel to transistor T3), transistor T4 is oriented perpendicularly to transistor T3 (and thus oriented in parallel or anti-parallel to transistor T2), thereby resulting in:

$$\frac{\Delta\mu_{T1}}{\mu_{T1}} = \frac{\Delta\mu_{T3}}{\mu_{T3}} \approx -\delta \text{ and } \frac{\Delta\mu_{T2}}{\mu_{T2}} = \frac{\Delta\mu_{T4}}{\mu_{T4}} \approx +\delta.$$

Such an embodiment also allows for a determination of $\delta$ for a measured value of $\Phi$. Such an embodiment increases the circuit's sensitivity to stress for any given value of $\omega$.

In one or more embodiments of the present invention, the circuit may be used as a "trip wire" to provide a binary indication of whether the stress has exceeded a specific threshold.

In one or more embodiments of the present invention, when the expected range of $\delta$ is not symmetric about zero, the width ratios may be chosen to have unequal values, i.e., $$\frac{W_{T2}}{W_{T1}} \neq \frac{W_{T3}}{W_{T4}},$$

to produce a symmetric measurement range about some non-zero number.

In one or more embodiments of the present invention, numerous versions of the circuit shown in FIG. 1 may be operated in parallel, each operating with a different width ratio and/or a different $\omega$ value, and therefore a different $\delta_{MAX}$ value. In such an embodiment, these multiple circuits with differing ranges may be used to achieve good resolution for a desired range of stresses.

Further, although the devices of FIG. 1 (and FIGS. 2 and 3 discussed below) are described as having particular sizes, values, and/or strengths, various differing sizes, values, and/or strengths may be used to effectuate particular behavior.

In one or more embodiments of the present invention, as shown in FIG. 2, an exemplary circuit 200 has eight transistors T1-T8 and three resistors R3-R5. Transistors T1-T8 are similar in design and operation to those described above with reference to FIG. 1. Resistors R3-R5 are laid out in the same orientation so that the stress does not change the ratio of their resistances. With such a configuration, it is still possible to extract $\delta$ for a measured value of $\Phi$.

In one or more embodiments of the present invention, as shown in FIG. 3, an exemplary circuit 300 has eight transistors T1-T8 and one resistor R6. Transistors T1-T8 are similar in design and operation to those described above with reference to FIG. 1. With such a configuration, it is still possible to extract $\delta$ for a measured value of $\Phi$.

In one or more embodiments of the present invention, PMOS transistors instead of NMOS transistors may be used to measure the stress.

In one or more embodiments of the present invention, a circuit may be formed using an amount of devices that differs from the amounts shown in FIGS. 1-3.

Further, a circuit in accordance with one or more embodiments of the present invention may use devices having characteristics (e.g., W) different than that of those shown in FIGS. 1-3 to effectuate particular behavior.

In one or more embodiments of the present invention, a circuit may produce a signal that is an amplified function of a stress on the circuit. Such amplification allows for improved analog and digital measurements.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising:
   a substrate;
   a first current mirror having a first current, formed of at least two devices disposed on the substrate, wherein, when a stress is present, a behavior of at least one of the at least two devices forming the first current mirror is dependent on a direction in which the at least one of the at least two devices forming the first current mirror is disposed on the substrate;
   a second current mirror having a second current, formed of at least two devices disposed on the substrate, wherein, when the stress is present, a behavior of at least one of the at least two devices forming the second current mirror is dependent on a direction in which the at least one of the at least two devices forming the second current mirror is disposed on the substrate; and
   a calculating device for calculating a ratio of a difference between the first current and the second current to a sum of the first current and the second current,
   wherein the at least one of the at least two devices forming the first current mirror is disposed in a first orientation different than a second orientation of the at least one of the at least two devices forming the second current mirror, and
   wherein the magnitude of the stress present is calculated based on the first orientation, the second orientation, and the ratio.

2. The computer system of claim 1, wherein, when the stress is present, carrier mobility of the at least one of the at least two devices forming the first current mirror is dependent on the direction in which the at least one of the at least two devices forming the first current mirror is disposed on the substrate.

3. The computer system of claim 1, wherein, when the stress is present, carrier mobility of the at least one of the at least two devices forming the second current mirror is dependent on the direction in which the at least one of the at least two devices forming the second current mirror is disposed on the substrate.

4. The computer system of claim 1, wherein the at least one of the at least two devices forming the first current mirror comprises a transistor.

5. The computer system of claim 4, wherein the transistor is one of a PMOS transistor and an NMOS transistor.

6. The computer system of claim 1, wherein the at least one of the at least two devices forming the second current mirror comprises a transistor.

7. The computer system of claim 6, wherein the transistor is one of a PMOS transistor and an NMOS transistor.

8. The computer system of claim 1, wherein the at least one of the at least two devices forming the first current mirror is an NMOS transistor, and wherein the at least one of the at least two devices forming the second current mirror is an NMOS transistor.

9. The computer system of claim 1, wherein the at least one of the at least two devices forming the first current mirror is a PMOS transistor, and wherein the at least one of the at least two devices forming the second current mirror is a PMOS transistor.

10. The computer system of claim 1, wherein the first current mirror and the second current mirror are operatively connected by a resistive path.

11. The computer system of claim 1, wherein the stress is at least one of a stress applied to the substrate and a stress exerted on a material in close proximity to the substrate.

12. A method of manufacturing, comprising:

disposing a first device on a substrate in a first orientation, the first device forming part of a first current mirror having a first current, wherein, when a stress is present, a behavior of the first device is dependent on a direction in which the first device is disposed on the substrate;

disposing a second device on the substrate in a second orientation such that the second orientation is different than the first orientation, the second device forming part of a second current mirror having a second current, wherein, when the stress is applied, a behavior of the second device is dependent on a direction in which the second device is disposed on the substrate; and disposing a calculating device on the substrate for calculating a ratio of a difference between the first current and the second current to a sum of the first current and the second current, wherein the at least one of the at least two devices forming the first current mirror is disposed in a first orientation different than a second orientation of the at least one of the at least two devices forming the second current mirror, and wherein the magnitude of the stress present is calculated based on the first orientation, the second orientation, and the ratio.

13. The method of claim 12, further comprising:

resistively connecting the first current mirror and the second current mirror.

14. The method of claim 12, wherein the first device comprises one of an NMOS transistor and a PMOS transistor.

15. The method of claim 12, wherein the second device comprises one of an NMOS transistor and a PMOS transistor.

* * * * *